(12) United States Patent
Steijns et al.

(10) Patent No.: US 12,248,255 B2
(45) Date of Patent: Mar. 11, 2025

(54) DIFFERENTIAL MEASUREMENT SYSTEM

(71) Applicant: ASML Netherlands B.V., Veldhoven (NL)

(72) Inventors: Hubert Matthieu Richard Steijns, Veldhoven (NL); Pulkit Aggarwal, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 226 days.

(21) Appl. No.: 17/916,730

(22) PCT Filed: Mar. 9, 2021

(86) PCT No.: PCT/EP2021/055884
§ 371 (c)(1),
(2) Date: Oct. 3, 2022

(87) PCT Pub. No.: WO2021/204478
PCT Pub. Date: Oct. 14, 2021

(65) Prior Publication Data
US 2023/0152718 A1 May 18, 2023

(30) Foreign Application Priority Data

Apr. 7, 2020 (EP) .................................... 20168356

(51) Int. Cl.
*G03F 7/00* (2006.01)
*G01F 1/06* (2006.01)
(Continued)

(52) U.S. Cl.
CPC ............ *G03F 7/7085* (2013.01); *G01F 1/065* (2013.01); *G01F 1/86* (2013.01); *G01M 3/38* (2013.01);
(Continued)

(58) Field of Classification Search
CPC ............... G03F 7/70975; G03F 7/7085; G03F 7/70341; G03F 7/16; G03F 7/20;
(Continued)

(56) References Cited

U.S. PATENT DOCUMENTS 4,692,614 A * 9/1987 Wilson .................. G01C 19/00
73/514.09
2003/0015590 A1 1/2003 Chen
(Continued)

FOREIGN PATENT DOCUMENTS

| CN | 109 708 823 A | 5/2019 |
|---|---|---|
| DE | 199 32 965 A1 | 1/2001 |

(Continued)

OTHER PUBLICATIONS

English translation of DE19932965, published Jan. 25, 2001. (Year: 2001).*

(Continued)

*Primary Examiner* — Christina A Riddle
(74) *Attorney, Agent, or Firm* — Sterne, Kessler, Goldstein & Fox P.L.L.C.

(57) ABSTRACT

A system for measuring the difference between a property of a first target and a property of a second target, the system comprising a first member and a second member, wherein the first member comprises a first pattern, and the speed of rotation of the first member is configured to be based on the property of the first target; and the second member comprises a second pattern wherein, the speed of rotation of the second member is configured to be based on the property of the second target, further wherein the first and second pattern are angularly-varying and are configured to generate an interference pattern by their interaction when the first and
(Continued)

second members have a relative difference in their rotational speeds, the interference pattern being indicative of the magnitude of this difference.

16 Claims, 7 Drawing Sheets

(51) Int. Cl.
    *G01F 1/86*      (2006.01)
    *G01M 3/38*      (2006.01)

(52) U.S. Cl.
    CPC ...... *G03F 7/70908* (2013.01); *G03F 7/70975* (2013.01)

(58) Field of Classification Search
CPC ..... G03F 7/24; G03F 7/42; G03F 7/70; G03F 7/70366; G03F 7/70641; G03F 7/70758; G03F 7/70775; G03F 7/70791; G03F 7/70991; G03F 9/00; G03F 7/70516; G03F 7/70525; G03F 7/70533; G03F 7/708; G03F 7/70808; G03F 7/70816; G03F 7/70841; G03F 7/70858–709; G03F 7/70908; G03F 7/70916; G03F 7/70925; G03F 7/70933; G03F 7/70941; G03F 7/7095; G03F 7/70958; G01F 1/065; G01F 1/86; G01F 15/02; G01F 3/06; G01M 3/38; G01M 3/3254; G01M 3/28; G01M 3/2807; G01L 3/12; G01L 3/08; G01L 3/109; G01L 9/0041; G01L 9/0076; G01L 9/0077; G01L 9/0079; G01J 11/00; G02B 27/60

USPC ............... 355/18, 30, 52–55, 72–77, 133; 356/399–401, 614–622

See application file for complete search history.

(56) References Cited

U.S. PATENT DOCUMENTS

| | | |
|---|---|---|
| 2003/0015591 A1* | 1/2003 | Chen .................. G01L 3/12 235/494 |
| 2010/0073758 A1 | 3/2010 | Konishi |
| 2011/0013159 A1 | 1/2011 | Kramer et al. |
| 2012/0069309 A1 | 3/2012 | Willems et al. |
| 2016/0077445 A1* | 3/2016 | Den Boef ............. G03F 9/7088 356/400 |
| 2017/0045414 A1 | 2/2017 | Ruinstein |
| 2019/0025713 A1 | 1/2019 | Kato et al. |

FOREIGN PATENT DOCUMENTS

| | | | | |
|---|---|---|---|---|
| EP | 1 653 501 A1 | | 5/2006 | |
| GB | 2185785 A | * | 7/1987 | ........... G01F 15/026 |
| JP | S64-072021 A | | 3/1989 | |

OTHER PUBLICATIONS

International Search Report and Written Opinion of the International Searching Authority directed to related International Patent Application No. PCT/EP2021/055884, mailed May 27, 2021; 15 pages.

* cited by examiner

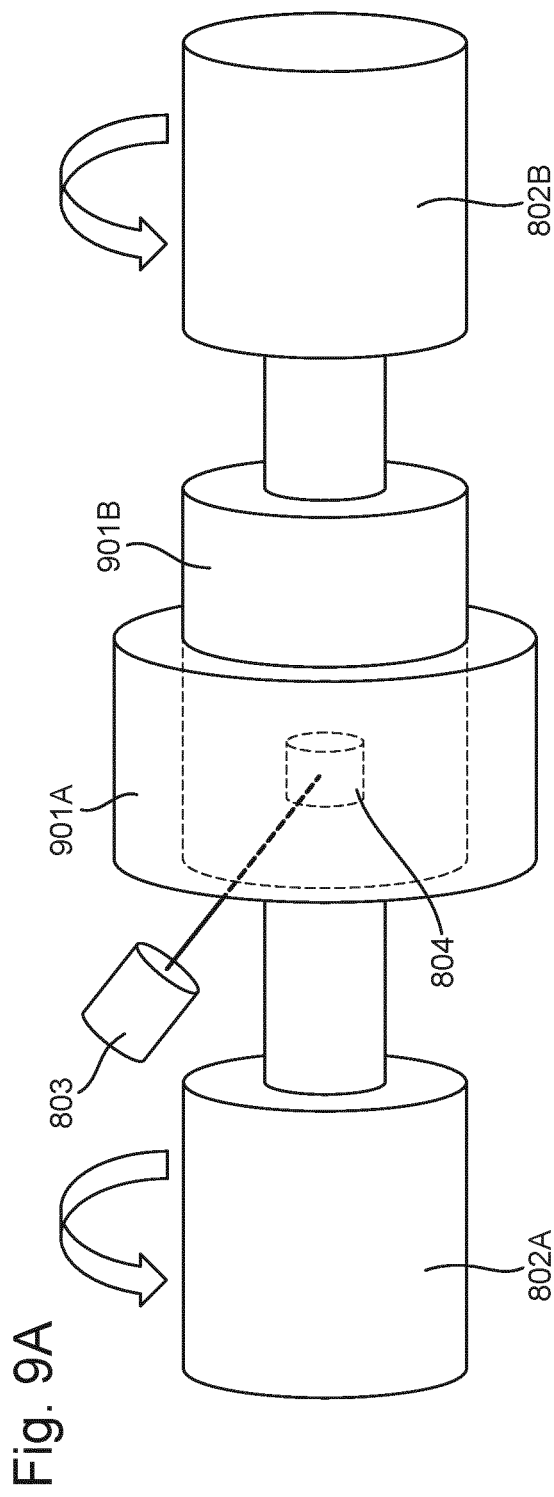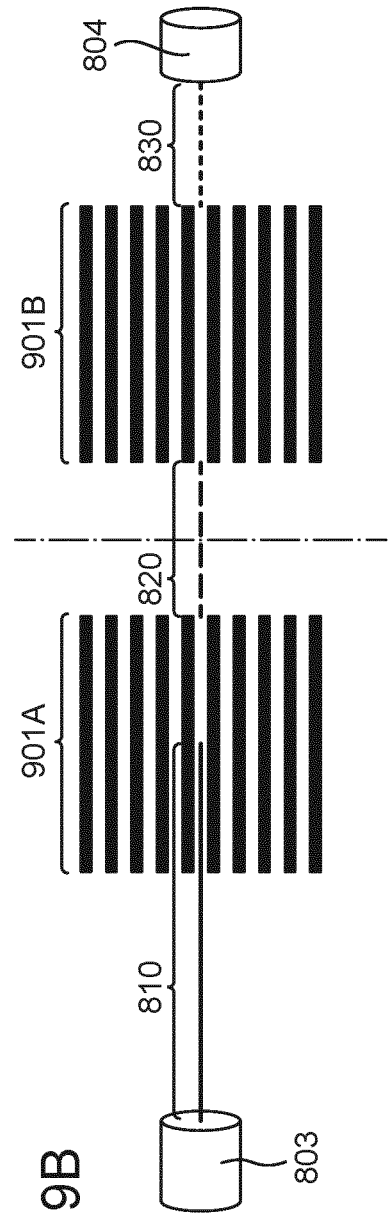
Fig. 9A
Fig. 9B

DIFFERENTIAL MEASUREMENT SYSTEM

CROSS-REFERENCE TO RELATED APPLICATIONS

This application claims priority of EP Application Serial No. 20168356.2 which was filed on 7 Apr. 2020, and which is incorporated herein in its entirety by reference.

FIELD

The present invention relates to systems and methods for measuring a property of targets, in particular for measuring differences in a property between two targets. A particular embodiment relates to a system and method for differential flow measurement in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

Many lithographic apparatuses use fluids for temperature control and other purposes. For example, temperature-controlled water may be used to maintain critical parts of an apparatus at constant temperature. Any leakage of water inside the machine could cause serious damage and desirably should therefore be detected quickly.

SUMMARY

It is desirable, for example, to provide a system for measuring the difference between a property of a first target and a property of a second target, wherein the difference is not derived by the subtraction of a measurement taken by one sensor from a measurement taken by a different sensor. In particular, it is desirable to provide a system for measuring the difference between an in-flow rate and an out-flow rate that does not overly rely on the calibration of two different sensors for the accuracy of the differential measurement.

According to an aspect of the invention, there is provided a system for measuring the difference between a property of a first target and a property of a second target, the system comprising a first member and a second member, wherein:
the first member comprises a first pattern, and the speed of rotation of the first member is configured to be based on the property of the first target; and
the second member comprises a second pattern wherein, the speed of rotation of the second member is configured to be based on the property of the second target,
further wherein the first and second pattern are angularly-varying and are configured to generate an interference pattern by their interaction when the first and second members have a relative difference in their rotational speeds, the interference pattern being indicative of the magnitude of this difference.

According to a further aspect of the invention, there is provided a method of measuring the difference between a property of a first target and a property of a second target, the method comprising:
rotating a first member comprising a first pattern at a speed based on the property of the first target;
rotating a second member comprising a second pattern at a speed based on the property of the second target;
whereby an interference pattern between the first and second patterns is formed when the first and second members have a relative difference in their rotational speed; and,
taking a differential measurement of the property of the first and second targets based on the interference pattern.

BRIEF DESCRIPTION OF THE DRAWINGS

Embodiments of the invention will now be described, by way of example only, with reference to the accompanying schematic drawings, in which:

FIG. 9 depicts another embodiment of the measurement system according to the present invention.

DETAILED DESCRIPTION

Figure 1:
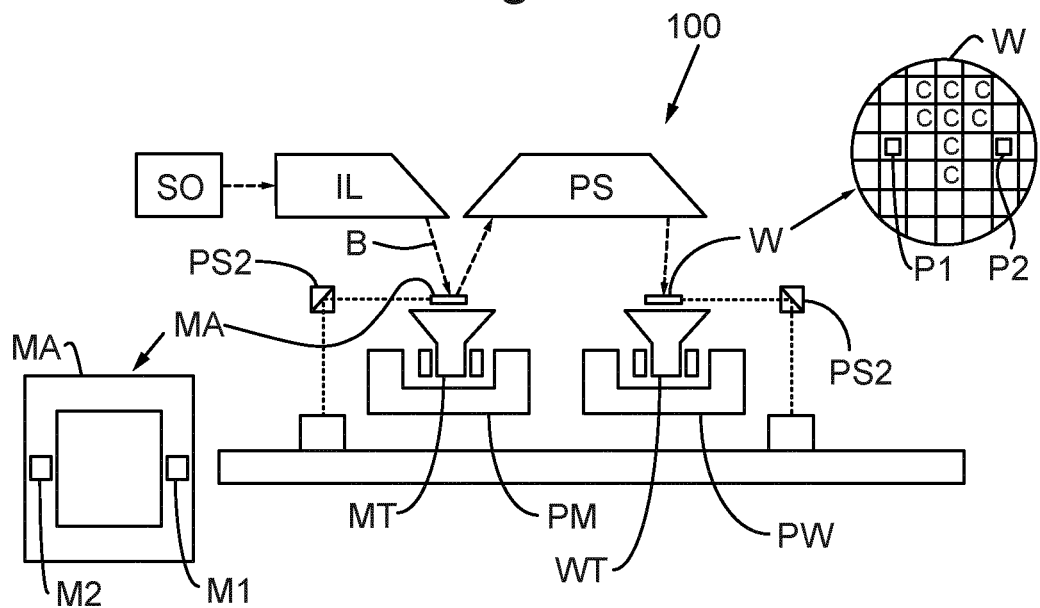
FIG. 1 depicts a lithography apparatus according to an embodiment of the invention.

FIG. 1 schematically depicts a lithography apparatus 100 including a source collector module SO according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithography apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithography apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithography apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a
target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.
3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
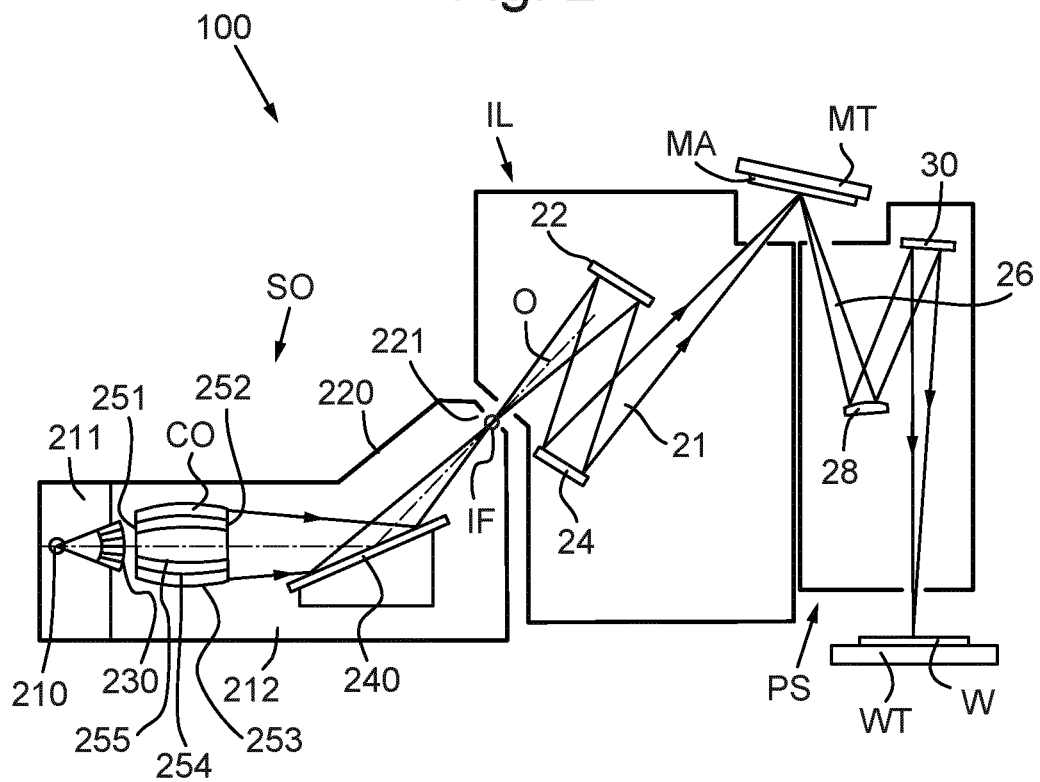
FIG. 2 is a more detailed view of the lithography apparatus.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) that is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO, which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithography apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
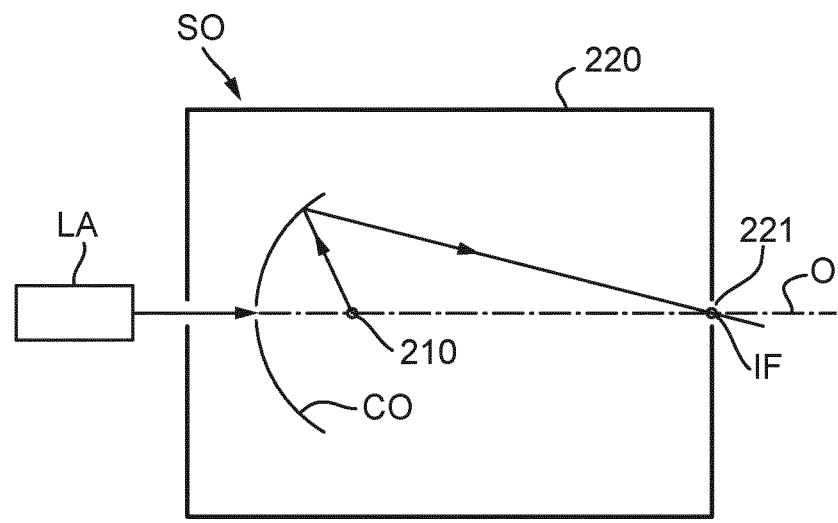
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

In a lithographic apparatus such as that described above, various components must be cooled or maintained at a very precise temperature. Often, temperature-controlled water is circulated through parts of the lithographic apparatus in order to perform cooling or temperature control. The lithographic apparatus is provided with a fluid inlet and a fluid outlet in order to receive fluid and expel fluid, e.g. water, from an external supply. It will be appreciated that a leak of a fluid, especially water, inside the lithographic apparatus is highly undesirable. As well as the possibility of costly damage and downtime to clean up a leak, a leak might affect the humidity within the lithographic apparatus which can affect sensors, such as interferometric displacement sensors, and lead to erroneous imaging.

A conventional approach to leak-detection in a lithographic apparatus is to provide a first flow sensor and a second flow sensor at a fluid inlet and a fluid outlet respectively. The presence of a leak can be detected by subtracting the measured flow value of the first sensor from the measured flow value of the second sensor. This approach of calculating a difference between two measurements in order to determine the presence or magnitude of a leak is prone to inaccuracies. If the first sensor and the second sensor are not calibrated accurately, the offset will give a large error in the difference measurement. Sensor calibration can involve correcting for sensor drift, signal de-noising, phase-shift compensation, digitization, or other conversion. The presence or magnitude of a leak in the compartment will therefore be inaccurately determined.

The present disclosure provides an apparatus and a method for measuring the difference between a property of a first target and a property of a second target using an interference pattern, e.g. a Moiré pattern. A Moiré pattern is an interference pattern generated by similar patterns that are superimposed at a small offset. In particular, the present disclosure provides an apparatus and a method for measuring the leakage flow in a compartment of a lithography apparatus by observing the generation of a Moiré pattern.

The present disclosure is directed towards directly measuring the difference between the property of the first target, and the property of the second target. It is desirable to measure the difference between the property of the first target and the property of the second target directly. In particular, it may be desirable to measure the leakage flow in a compartment without subtracting an inflow measurement taken by a first flow sensor, from an outflow measurement taken by a second flow sensor.

Figure 4:
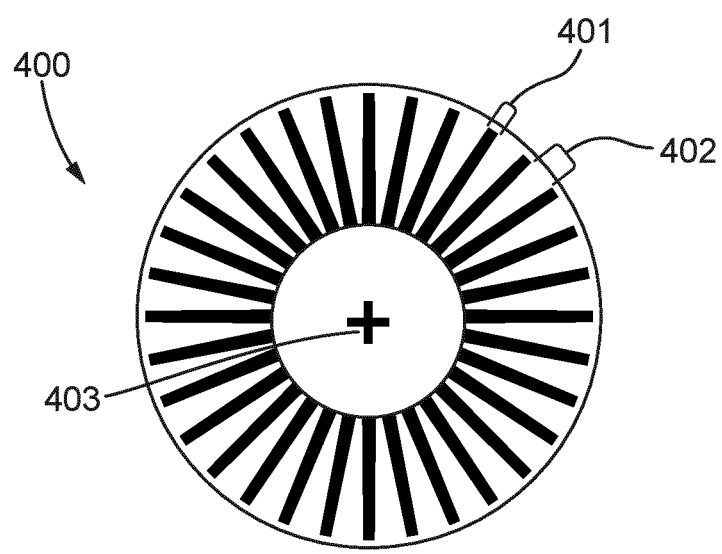
FIG. 4 depicts a first pattern that has an angular variation.
Figure 5:
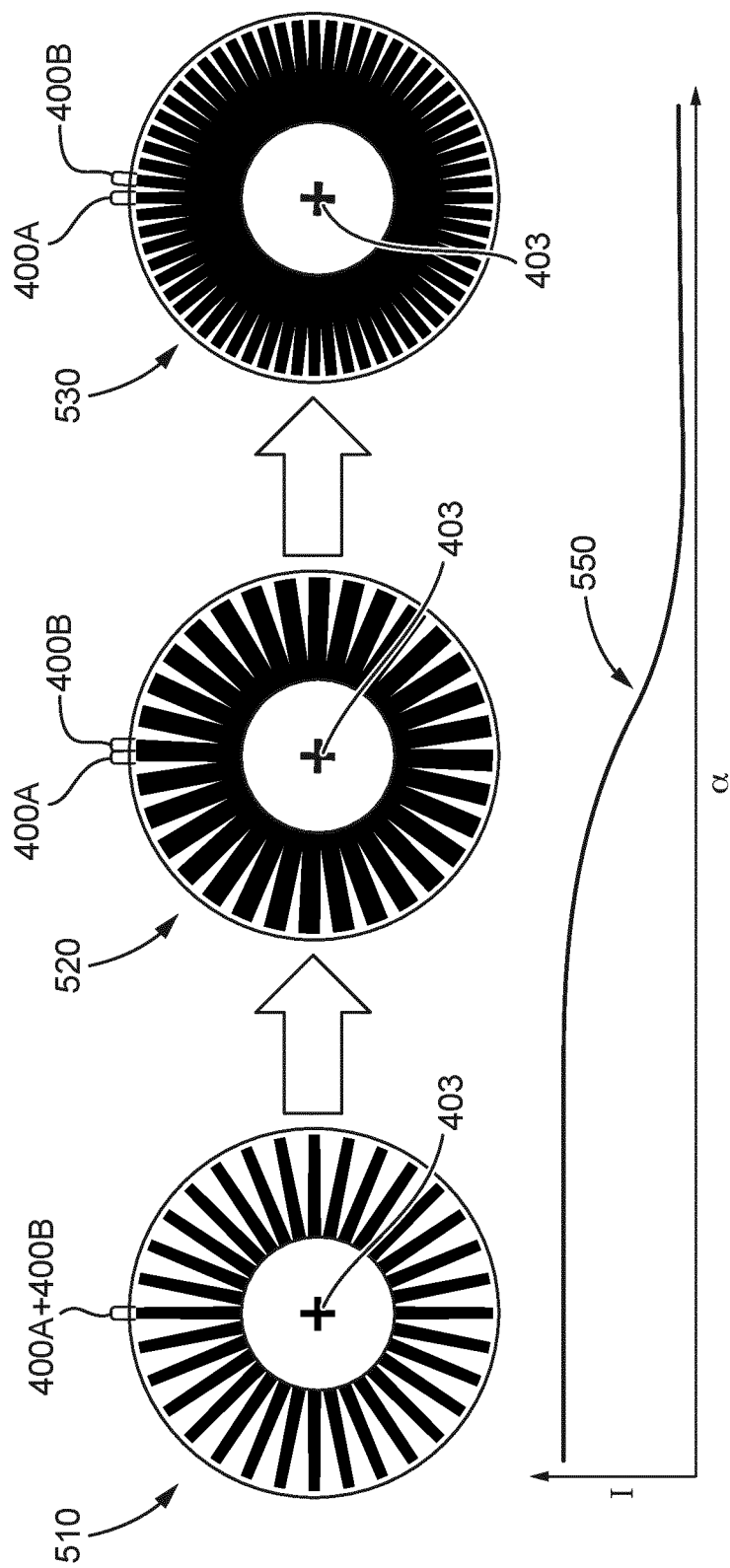
FIG. 5 depicts the pattern of FIG. 4 superimposed on a second identical pattern, and the appearance of the interference generated when the second identical pattern is rotated relative to the first pattern.

FIG. 4 and FIG. 5 illustrate the principle of generating a Moiré pattern by rotation, as used in the present invention.

FIG. 4 depicts a single pattern 400. The pattern 400 has an angular variation with respect to the axis 403. The pattern may comprise two components. In FIG. 4, the pattern has a first component 401 and a second component 402. Desirably, the pattern comprises plurality of first components 401 and a plurality of second components regularly arranged in an alternating manner around the axis 403.

In FIG. 4, the first component 401 is depicted in black and the second component 402 is depicted in white. In practice, the first component 401 and the second component 402 are distinguished by any difference in an optical property, or other property. For example, the first component 401 may have a lower transmissivity than the second component 402. Alternatively, the first component 401 may have a lower reflectivity than the second component 402. Other configurations of the present disclosure may distinguish the first and second component with any of the following properties: different refractive indices; concentric patterns with a different number of lines/spokes.

While pattern 400 has the appearance of a spoked wheel, any other angularly-varying pattern could be used in the present invention. The pattern 400 may have rotational symmetry. It may be preferable for the pattern 400 to have as many axes of rotational symmetry as is practical to manufacture. It may be preferable for the pattern 400 to have a particular number of axes of rotational symmetry, as will be described in more detail. Conversely, the pattern may not have any axes of rotational symmetry.

While not shown in FIG. 4, pattern 400 may have a third or more components. These additional components are distinguished by having different optical or other properties to the first component and the second component.

While the first component and the second component are shown in FIG. 4 to be binary in nature, i.e. either "black" or "white", it will be appreciated that the principle of the present disclosure does not exclude non-binary pattern arrangements. The pattern 400 may comprise gradients, or other intermediate components.

The axis 403 may preferably be disposed at the centroid of the pattern 400. In the embodiment of FIG. 4, the pattern is circular, and the axis 403 is disposed at the center of the circle. While it may be preferable that the axis 403 is at the centroid of the pattern 400, non-centroid axes are possible and can still function under the principle of the present disclosure.

FIG. 5 is a schematic depiction of how a Moiré pattern can be generated according to the present disclosure. In FIG. 5, and in the present disclosure generally, the offset between patterns is generated by rotation.

Schematics 510, 520 and 530 illustrate the interference pattern generated by two superimposed copies of pattern 400, the two copies referred to as pattern 400A and pattern 400B. In these schematics, pattern 400B is rotated clockwise with respect to pattern 400A. For the purposes of illustration, the first component 401 of both patterns 400A and 400B is opaque, and the second component 402 of both patterns 400A and 400B is transparent.

In the foregoing, the term "Moiré pattern" refers to this interference pattern produced by superimposing pattern 400A and pattern 400B. The Moiré pattern resulting from pattern 400A and pattern 400B depends on the relative placement of the first component 401A of pattern 400A and the second component 402A of pattern 400A, with the first component 401B of pattern 400B and the second component 402B of pattern 400B.

The resulting Moiré pattern can be inferred using binary logic. Pattern 400A can be considered as a first input, and pattern 400B can be considered as a second input. The first component 401 of both patterns 400A and 400B can be considered a [1] input, and the second component 402 of both patterns 400A and 400B can be considered a [0] input. The resulting Moiré pattern can therefore be considered an "400A OR 400B" operation in binary logic, applied across the whole 2-dimensional pattern.

Where the first component 401A of pattern 400A overlaps with the first component 401B of pattern 400B, this component of the Moiré pattern has the appearance of a first component 401 (in the Figure, it is opaque/black). Where the first component 401A of pattern 400A overlaps with the second component 402B of pattern 400B, this component of the Moiré pattern also has the appearance of a first component 401 (in the Figure, it is opaque/black). Where the second component 402A of pattern 400A overlaps with the first component 401B of pattern 400B, this component of the Moiré pattern also has the appearance of a first component 401 (in the Figure, it is opaque/black). However, where the second component 402A of pattern 400A overlaps with the second component 402B of pattern 400B, this component of the Moiré pattern has the appearance of a second component 402 (in the Figure, it is transparent/white).

In schematic 510, the two patterns 400A and 400B are superimposed on each other with an identical axis 403, and are aligned by a common axis of rotational symmetry. The resulting interference pattern has the appearance of either one of pattern 400A or 400B. In other words, no interference pattern is apparent.

In schematic 520, pattern 400B has been rotated clockwise about the shared axis 403, while pattern 400A has been kept stationary. Applying the "OR" binary logic operation between the two patterns, in the regions where: the first component 401A of pattern 400A overlaps with the first component 401B of pattern 400B; or, the first component 401A of pattern 400A overlaps with the second component 402B of pattern 400B; or, the second component 402A of pattern 400A overlaps with the first component 401B of pattern 400B; the corresponding region of the Moiré pattern is black, or opaque. Conversely, where the second component 402A of pattern 400A overlaps with the second component 402B of pattern 400B, the corresponding region of the Moiré pattern is white, or transparent. In the example of schematic 520, this Moiré pattern gives the appearance that the opaque/black spokes on the pattern have thickened compared to pattern 400 and Moiré pattern 510.

Schematic 530 shows a further clockwise rotation of pattern 400B with respect to pattern 400A. In this schematic, the two patterns are perfectly "out of phase" with respect to their axes of rotational symmetry. At this amount of relative rotation between patterns 400A and 400B, there is the highest possible proportion of a first component 401 (in the Figure, opaque/black) in the Moiré pattern overall. In other words, the overall Moiré pattern is as "dark", or "opaque" as possible.

The resulting Moiré patterns 510, 520 and 530 have different proportions of a first component 401 and a second component 402, wherein the first component in the Figure is black/opaque and the second component in the Figure is transparent/white.

The present apparatus and method uses the phenomenon of these different Moiré patterns in order to measure a property difference between two targets, explained in detail below.

In FIG. 5, curve 550 indicates how the proportion of a second component 402 on the Moiré pattern varies as the patterns 400A and 400B are rotated relative to each other. The vertical axis "I" denotes the total area of the second component 402 in the Moiré pattern. Axis "I" can also be considered to denote the amount of light that is able to pass through the Moiré pattern if the second component 402 is transparent. The horizontal axis "a" denotes the angle of rotation of pattern 400B relative to pattern 400A. The curve 550 corresponds to the Moiré schematics 510, 520 and 530 above it.

In practice, the first component 401 and the second component 402 are distinguished by any difference in an optical property, or other property. Therefore, the "value I" can generally be considered to be the transmissivity, of the Moiré pattern, where the second component 402 has a higher transmissivity than the first component 401.

As depicted in FIG. 5, schematic 510, and by the corresponding point in curve 550, the value of I is highest when patterns 400A and 400B have no difference in angular rotation. In other words, their points of rotational symmetry correspond and no interference pattern is apparent.

As depicted in FIG. 5, schematic 520, and by the corresponding point in curve 550, the value of I is intermediate when patterns 400A and 400B have a slight difference in angular rotation.

In other words, their points of rotational symmetry are slightly out of phase and the interference pattern is apparent.

As depicted in FIG. 5, schematic 530, and by the corresponding point in curve 550, the value of I is lowest when patterns 400A and 400B are completely out of phase with respect to their points of rotational symmetry.

This variation in the value I can occur with respect to relative rotation, even when the whole area of the Moiré pattern is not observed. A variation in I may be observed when only a small portion of the total pattern area is observed. Accordingly in the foregoing, a variation in I may refer to this property over a whole pattern, or refer to this property over a smaller area of the pattern.

Figure 6:
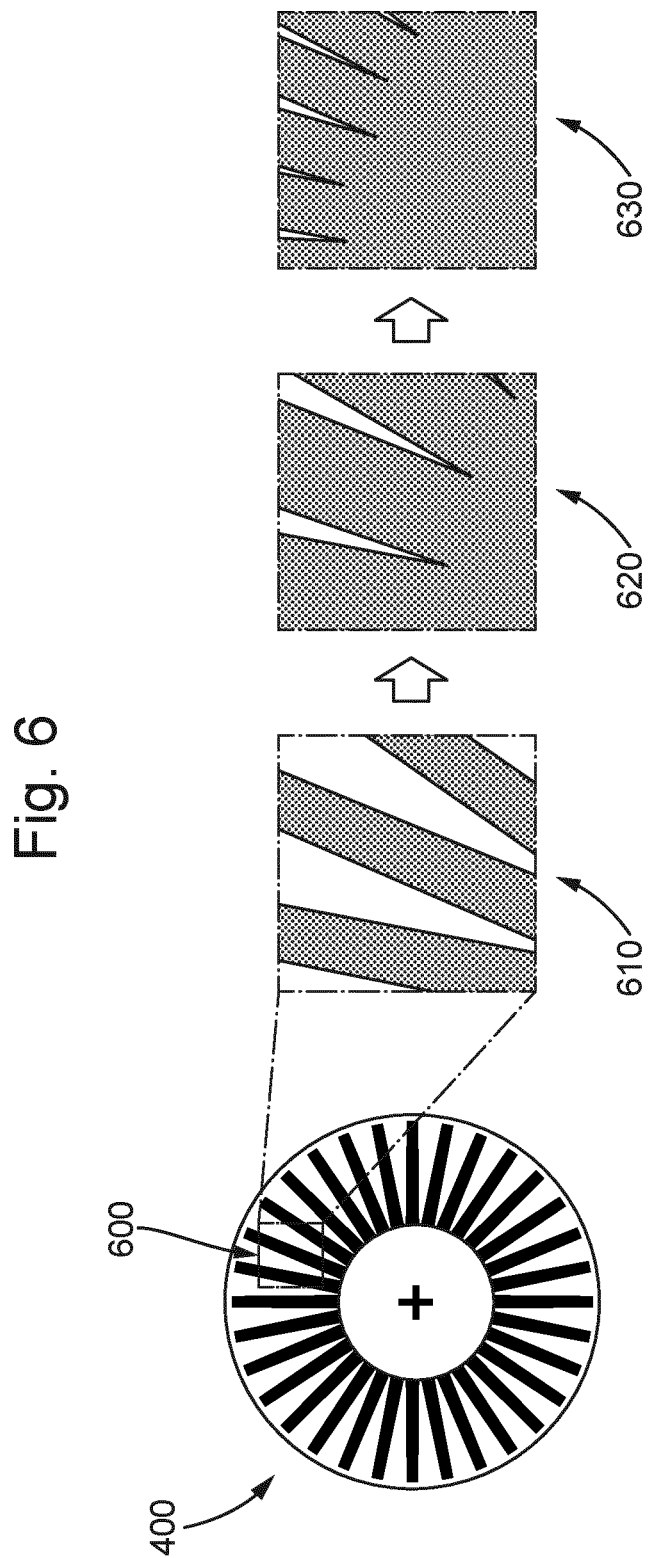
FIG. 6 depicts the pattern of FIG. 4 superimposed on a second identical pattern, and the appearance of the interference generated when the second identical pattern is rotated relative to the first pattern, for a small portion of the overall pattern.

FIG. 6 depicts a portion of the Moiré pattern that is generated due to the relative rotation of patterns, similarly to as in FIG. 5. Pattern 400 is depicted with an area of observation 600. The area of observation 600 only encompasses the ends of several spokes in the pattern 400.

Subfigures 610, 620 and 630 show the area of observation 600 for the schematics 510, 520 and 530. Subfigures 610, 620 and 630 show that while the whole pattern is not under observation, a change in the ratio between the first opaque/black component 401 and a second transparent/white component 402. Therefore in the foregoing it should be understood that the change in the ratio between the first opaque/black component 401 and a second transparent/white component 402, or the change in the value of I occurs not only over the whole Moiré pattern, but also occurs independently in small portions of the Moiré pattern.

Schematics 530 and 630 portray the Moiré pattern arising when patterns 400A and 400B are completely out of phase. If pattern 400B was further rotated clockwise from its position in schematics 530 and 630, a Moiré pattern similar to 520 and 620 would arise. If pattern 400B was even further rotated clockwise, the points of rotational symmetry of 400A and 400B would at some point align again, as in 510 and 610.

Therefore, rotating pattern 400B with respect to pattern 400A at a constant angular velocity yields a periodic fluctuation in the value of I. The peaks in the value of I correspond to where the points of rotational symmetry of patterns 400A and 400B align. The troughs in the value of I correspond to where the axes of rotational symmetry of patterns 400A and 400B are completely out of phase.

Figure 7:
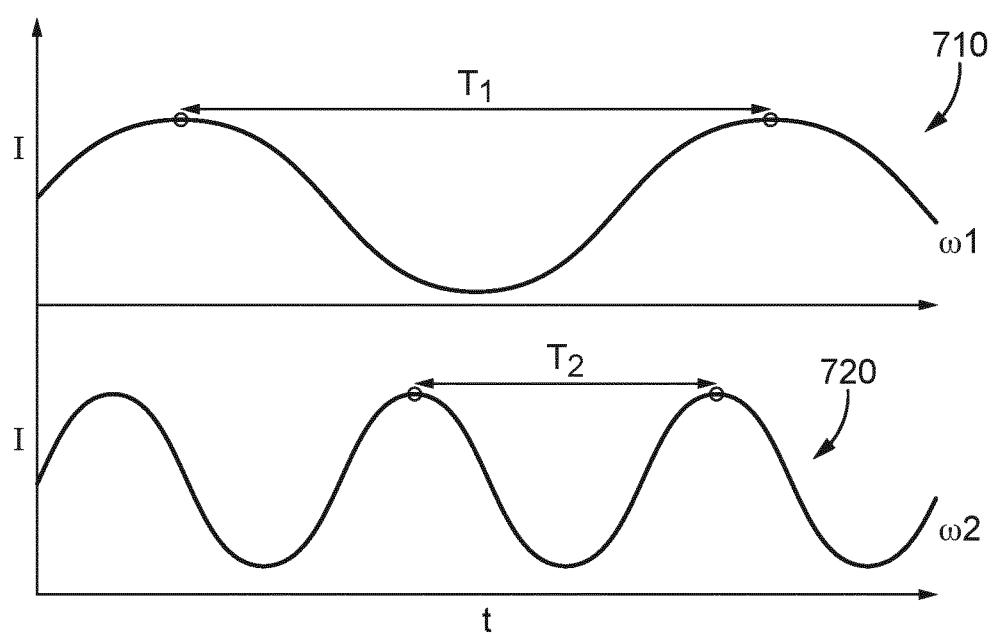
FIG. 7 depicts the time relationship between the angular velocity of the second pattern and the change in the generated interference.

FIG. 7 illustrates the periodic fluctuation in the value of I for two different relative angular speeds between the patterns 400A and 400B. The vertical axis denotes the value of I and the horizontal axis denotes time. The curves 710 and 720 denote the variation of the value of I over time.

A first angular speed $\omega 1$ is lower than a second angular speed $\omega 2$. The curve 710 depicts the time-dependent variation of I when 400B rotates at the angular velocity $\omega 1$. The curve 720 depicts the time-dependent variation of I when 400B rotates at the angular velocity $\omega 2$. Curve 710 has a lower frequency than curve 720. The period T1 is larger than the period T2.

Therefore, if pattern 400A is kept stationary, and pattern 400B is rotated relative to pattern 400A, the speed of angular rotation $\omega$ of the pattern 400B can be inferred from the frequency of oscillation in the value of I. A higher frequency of oscillation in the value of I denotes a higher speed of angular rotation $\omega$.

It will be appreciated that while the above has only discussed examples where the first pattern 400A is kept stationary, the absolute rotation of patterns 400A and 400B do not influence the Moiré pattern. For example, if patterns 400A and 400B were rotated in the same direction and at the same speed, no interference pattern would emerge, and there would be no variance in the value of I.

In other words, the Moiré patterns depicted in FIGS. 5 and 6 only emerge due to a relative angular displacement between patterns 400A and 400B. Consequently, the frequency of variation in the value I depends only on the relative angular speeds of 400A and 400B.

It is for this reason that the Moiré patterns of the present disclosure are particularly suitable for taking a difference measurement. In the present invention, the speed of rotation of a first member containing a pattern that has an angular variation is based on a property of a first target; and the speed of rotation of a second member containing a pattern that has an angular variation is based on a property of a second target. The patterns on the first and second members are superimposed to generate a Moiré pattern.

Therefore, only the difference between the property of the first target and the property of the second target generates change in the superimposed patterns thereby generating the Moiré pattern. If the property of the first target and the second target are the same, no change in the Moiré pattern will be detected.

It is useful to note that any change in the Moiré pattern depends on the magnitude of the difference between the property of the targets, and not the magnitude of the property of the targets. This gives rise to a higher accuracy. In essence, the "common mode signal" between the property of the first target and the property of the second target is eliminated.

Figure 8:
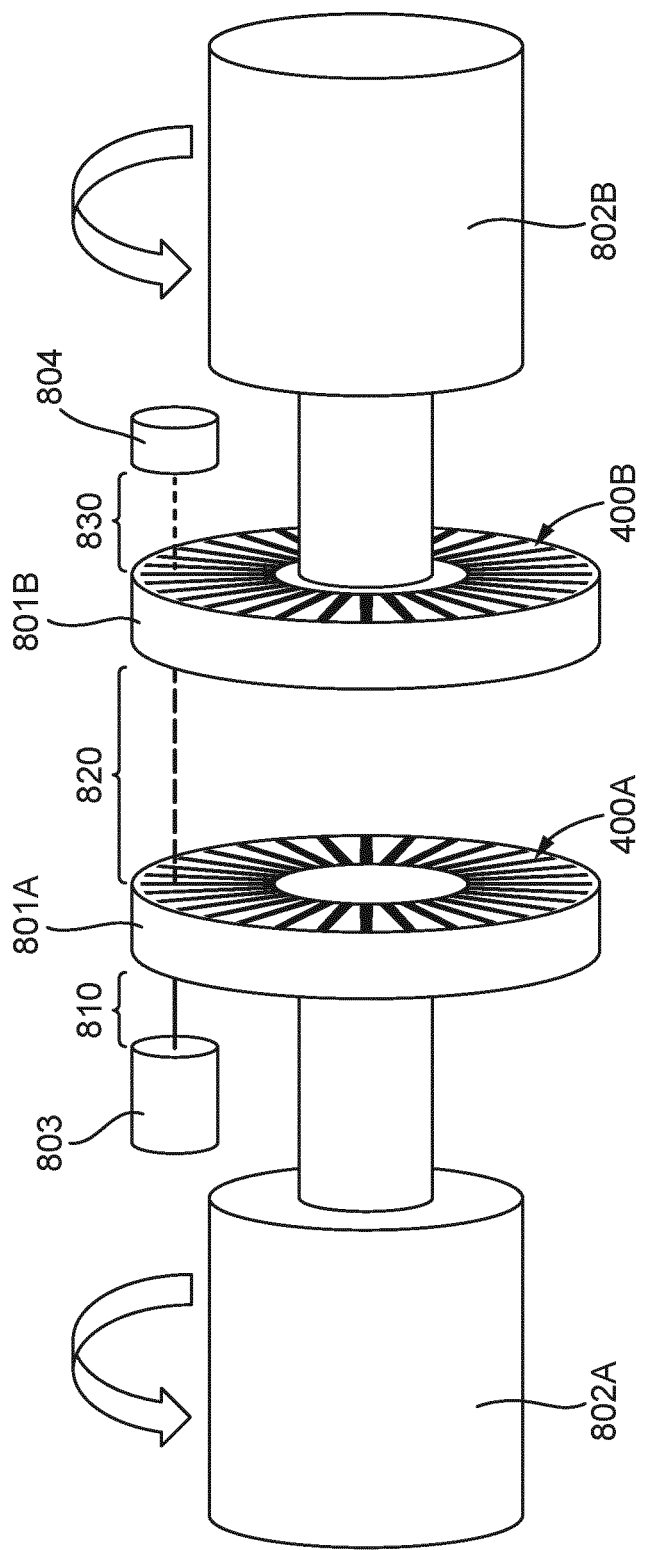
FIG. 8 depicts an embodiment of the measurement system according to the present invention.

FIG. 8 depicts a practical example of the above principle applied to an apparatus for detecting leaks in a lithographic apparatus. A first flow rotor 802A is coupled to a first point in a channel of the fluid circulation system, e.g. at the inlet, and configured to rotate in accordance with the rate of flow at the first point. Desirably the first flow rotor 802A is configured to rotate at a rate that is proportional to the mass flow rate of fluid at the first point. A second flow rotor 802B is coupled to a second point in the channel of the fluid circulation system, e.g. at the outlet, and configured to rotate in accordance with the rate of flow at the second point. Desirably the second flow rotor 802B is configured to rotate at a rate that is proportional to the mass flow rate of fluid at the second point. Desirably the relationship between rate of rotation of each of rotors 802A, 802B and flow at the respective points in the channel is the same.

It will be appreciated that the flow rotors do not have to be disposed at the inlet and outlet but can be disposed anywhere convenient in a fluid circulation system. Multiple pairs of flow rotors may be disposed within a fluid circulation system so as to allow the location of any leak to be determined.

Each of flow rotors 802A, 802B is coupled to a respective one of first and second transparent disks 801A, 801B. Transparent disks 801A, 801B are examples of rotating members. First pattern 400A is provided on first transparent disk 801A and second pattern 400B is provided on second transparent disk 801B. A light source 803 (e.g. a laser, LED or laser diode) emits a first beam 810 toward transparent disk, the light is modulated by the first pattern and propagates in a second beam 820 to the second transparent disk 801B. The light is further modulated by the second pattern 400B and propagates to a detector 804 as a third beam 830. The combination of the modulation of the light by the first and second patterns 400A, 400B represents or encodes the Moiré pattern defined by the relative angular positions of the first and second transparent disks 801A, 801B.

Light source 803 may include focusing, collimating, directing or other beam forming components. Detector 804 may include light collecting elements and filters to reject stray light.

In operation, an intensity signal measured by the detector 804 will vary with time. The time variation will comprise two signal components: a first signal component determined by the angular frequency of the first pattern 400A and the rate of rotation of second transparent disk 801A and a second signal component determined by the angular frequency of the second pattern 400B and the rate of rotation of second transparent disk 801B. Since it is expected that any leak in the fluid circulation system is small compared to the flow rate through the system, the difference in frequency between the first and second signal components will be small, the sum of these components will provide a signal that is the combination of a fundamental signal and a beat signal. The beat signal represents the Moiré pattern and can be detected by various means such as: a frequency analyzer, a low-pass filter or a fast Fourier transform (FFT).

It will be appreciated that FIG. 8 depicts a very simple embodiment of the invention and many variations thereon are possible.

For example, gearing can be provided between the flow rotors and the transparent disks to increase the rate of rotation of the transparent disks. Such gearing increases the frequency of the fundamental signal and beat signal which can make them easier to separate and increase accuracy of measurement of the beat signal and hence the leak rate.

It is desirable for accuracy that the two flow rotor and disk combinations are identical but if for any reason a change in one parameter of one half of the system is necessary a compensatory change can be made in another parameter of the same or the other half of the system. For example, space considerations might require that one of the rotors has to be made smaller so that it rotates with a different constant of proportionality to the mass flow rate in which case a compensatory gearing can be introduced in the other half of the system or the patterns can have a different angular frequency.

If it is not convenient to provide a beam path directly from source 803 to detector 804 through disks 801A, 801B, an optical system can be provided to conduct the beam as required. The optical system may comprise: optical fibers; free space optics such as lenses and mirrors; or any combination thereof. Optical fibers may be especially advantageous if the two points in the fluid circulation system are far apart.

The light beam can be conducted through the two transparent disks multiple times. Such an arrangement may be advantageous in increasing the variation in the intensity signal if the patterns have low contrast.

The relative sizes of the cross-section of the beam and the pattern components can be selected for various different effects. If the beam is small relative to the pattern components then the fundamental signal will have a large amplitude. This can be useful for noise rejection or to enable an absolute flow rate measurement to be obtained in addition to the differential flow rate. If the beam is large compared to the pattern components the amplitude of the fundamental signal will be reduced and can be made negligible. This can avoid the need to electronically separate the beat signal representing the Moiré pattern from the fundamental signal.

In an embodiment, the patterns 400A, 400B are each divided into two corresponding concentric annular regions. The angular frequency of the two components 401, 402 in a first annular region is different than the angular frequency of the two components in a second annular region. Desirably the angular frequencies of the two annular regions are mutually prime. The light beam is arranged to pass through both annular regions, e.g. by being large enough to overlap both annular regions. Alternatively two light beams, one passing through each annular region, can be used. The two light beams can be directed onto one sensor or have separate sensors whose outputs are combined electronically. This arrangement can address an issue that if the two transparent discs develop a constant offset whereby their patterns are exactly out of phase no light reaches the detector 804 which can make signal acquisition difficult and result in a low signal to noise ratio such that dark noise in the detector can lead to false positives. Since, in this arrangement the patterns in the two annular regions have different angular frequencies there will be no relative position of the two discs in which both annular regions are completely opaque.

In another embodiment, shown in FIGS. 9A and 9B, the discs are replaced by drums 901A, 901B and the radial patterns are replaced by patterns 410A, 410B comprising dark bands 411 and light bands 412. Drums 901A, 901B are examples of rotating members. Other parts of this embodiment are the same as those of the embodiment of FIG. 8 and have like reference numerals.

Dark bands 411 and light bands 412 can be parallel to the axis of the respective drum or at an angle so as to form spirals. Like the regions 401, 402 the duty ratio of the dark and light bands is desirably 50% but other values are possible.

Various different configurations are possible with drums 901A, 901B. In the illustrated configuration the light bands of both drums are transparent and drum 901B is located inside drum 901A, e.g. concentrically. Light source 803 is outside drum 901B and detector 804 is inside drum 901B so that light passes through both drums. In another configuration, the light bands of drum 901B are reflective and detector 804 is outside drum 901A, e.g. adjacent light source 803. In another configuration drums 901A and 901B are spaced apart rather than nested and the light bands on both drums are reflective. The light source is arranged to direct light onto the drums so that it reflects off both to reach the detector. The drums need not be cylindrical, for example conical drums can be convenient in some configurations, nor do both drums need to have the same shape. Other configurations are possible.

It will be appreciated that a "light region" or "light band" of a pattern is one which allows light to reach the detector whereas a "dark region" or "dark band" is one which prevents or reduces light reaching the detector. Depending on the configuration of the system and the nature of the member on which the pattern is provided, a light region might be transmissive or reflective. Similarly a dark region may be transmissive, reflective or absorbing.

It will also be appreciated that the variations described in relation to FIG. 8 can be combined with each other in various ways and can also be applied to the arrangement of FIGS. 9A and 9B.

As mentioned above, for leak detection it is desirable that the flow rotors measure mass flow rate. It is also possible to use flow rotors that measure volume flow rate. In that case, if there is a significant temperature difference between the fluid at the first point and the fluid at the second point and the fluid has a non-negligible coefficient of thermal expansion, it is possible to measure the temperatures of the fluid at the two points and apply a correction to the apparent leakage measured by the flow differential.

In addition to the detection of leaks, it will be appreciated that the present invention can be used to measure intentional differences between two flows. For example it might be useful to know the flow rate in a small branch off a main flow where it is difficult to measure the flow in the branch to be measured directly. The present invention can be used to measure the difference in flows in a main channel before and after a branch and thereby infer the flow in the branch.

Whilst the invention has been described in relation to measurement of flow rates of fluid it will be appreciated that the principle of the invention can be applied to measurement of any other property that can be converted to a rotatory motion.

Embodiments of the invention have been described in the context of a lithographic apparatus employing EUV radiation. It will be appreciated that the invention may also be applied in other type of lithography apparatus—such as DUV lithographic apparatus, e-beam lithographic apparatus or imprint lithographic apparatus—and to other tools used in semiconductor manufacture such as assessment tools (e.g. metrology tools, inspection tools and scanning electron microscopes). Lithographic apparatus and these other tools may be collectively referred to as lithographic tools and have the common characteristics that fluids, e.g. water, are circulated through the tool, e.g. for temperature control, and that leaks of fluid may lead to very costly damage and downtime.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described.

The descriptions above are intended to be illustrative, not limiting. Thus it will be apparent to one skilled in the art that modifications may be made to the invention as described without departing from the scope of the claims set out below.

The invention claimed is:

1. A system comprising:
   first and second coaxial members configured to have an axis of rotation substantially parallel to a light path, wherein:
     the first member comprises a first pattern and is arranged to rotate with a first speed of rotation, wherein the first speed of rotation of the first member is configured to be based on a flow rate of a first target,
     the second member comprises a second pattern and is arranged to rotate with a second speed of rotation, wherein the second speed of rotation of the second member is configured to be based on a flow rate of a second target, and
     the first and second patterns have an angular variation and are configured to generate an interference pattern from a light beam traveling along the light path based on their interaction with the light beam and in response to the first and second members having a relative difference in their rotational speeds, the interference pattern being indicative of a magnitude of this difference; and
   a fluid circulation system having a fluid inlet and a fluid outlet,
   wherein the system is configured to measure a difference between flow rates of the fluid inlet and the fluid outlet.

2. The system of claim 1, wherein:
   the first and second patterns comprise a first and a second component, the first component has a lower transmissivity than the second component; or the first component has a lower reflectivity than the second component.

3. The system of claim 1, wherein:
the first member is attached to a flow rotor disposed at the inlet,
the second member is attached to a flow rotor disposed at the outlet, and
the first and second members are attached to the flow rotors via a gear mechanism, such that the rotational speed of the first and second members are higher than the rotational speed of the respective flow rotors.

4. The system of claim 1, wherein the first and second members are disks, with the first and second patterns formed on or through a surface of the disks.

5. The system of claim 1, wherein the first and second members are concentric drums, with the first and second patterns formed on or through a surface of the drums in an overlapping portion of the drums.

6. The system of claim 1, wherein:
a light source is disposed to impinge light on or through the interference pattern,
a sensor is configured to receive a light signal indicative of the relative difference in rotational speeds between the first and second members, and
an optical fiber is disposed between the first and second members to communicate light from the light source between them.

7. The system claim 1, wherein one or more temperature sensors are configured to measure a temperature at the first and second targets, such that the magnitude of a difference signal provided by the interference pattern is calibrated based on the measured temperature difference.

8. The system of claim 1, wherein the first pattern is different from the second pattern, such that in response to the first and second members rotating at the same speed, a resulting superimposed pattern between the first and second patterns is an angularly-varying pattern.

9. The system of claim 1, wherein the first pattern and the second pattern are divided into two concentric annular regions.

10. A lithographic tool comprising the system of claim 1.

11. The lithographic tool of claim 10, wherein the fluid circulation system is configured to circulate temperature-controlled water.

12. The system of claim 1, wherein the first and second patterns are provided in a plane perpendicular to the axis of rotation.

13. A method comprising:
rotating a first member comprising a first pattern at a first speed based on a first fluid flow rate of a first target;
rotating a second member positioned coaxial to the first member and comprising a second pattern at a second speed based on a second fluid flow rate of a second target;
forming an interference pattern between the first and second patterns based on a light beam traveling along a light path substantially parallel to an axis of rotation of the first and second members and in response to the first and second members having a relative difference in their rotational speed; and
taking a differential measurement of the first and second fluid flow rates of the first and second targets based on the interference pattern.

14. The method of claim 13, further comprising:
monitoring a first temperature related to the first target;
monitoring a second temperature related to the second target; and
using the difference between the first temperature and the second temperature to calibrate an inferred differential flow rate measurement between the first and second targets based on the interference pattern.

15. The method of claim 13, further comprising:
providing a beam to impinge on or travel through the first and second patterns so as to be modulated by the interference pattern,
monitoring an amplitude of the beam after it has been modulated by the interference pattern; and
determining a difference between the first and second fluid flow rates of the first and second targets based on an amplitude of the beam over time.

16. The method of claim 13, further comprising arranging the first and second patterns in a plane perpendicular to the axis of rotation.

* * * * *